(12) United States Patent
Kirihata et al.

(10) Patent No.: US 6,266,272 B1
(45) Date of Patent: Jul. 24, 2001

(54) PARTIALLY NON-VOLATILE DYNAMIC RANDOM ACCESS MEMORY FORMED BY A PLURALITY OF SINGLE TRANSISTOR CELLS USED AS DRAM CELLS AND EPROM CELLS

(75) Inventors: Toshiaki Kirihata, Poughkeepsie; Daniel Storaska, Wappingers Falls; Chandrasekhar Narayan, Hopewell Junction, all of NY (US); William Tonti, Essex Junction, VT (US); Claude Bertin, S. Burlington, VT (US); Nick van Heel, Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/364,841

(22) Filed: Jul. 30, 1999

(51) Int. Cl.[7] .................................................. G11C 14/50
(52) U.S. Cl. ...................................... 365/185.08; 365/222
(58) Field of Search ............................... 365/185.08, 222

(56) References Cited

U.S. PATENT DOCUMENTS

| | | | | |
|---|---|---|---|---|
| 4,611,309 | * | 9/1986 | Chuang et al. | 365/185 |
| 5,126,969 | * | 6/1992 | Kawana | 365/149 |
| 5,325,327 | * | 6/1994 | Ema | 365/185 |
| 5,359,571 | * | 10/1994 | Yu | 365/230.03 |

* cited by examiner

Primary Examiner—Vu A. Le
Assistant Examiner—Tuan T. Nguyen
(74) Attorney, Agent, or Firm—H. Daniel Schnurmann

(57) ABSTRACT

A Partially Non-Volatile Dynamic Random Access Memory (PNDRAM) uses a DRAM array formed by a plurality of single transistor (1T) cells or two transistor (2T) cells. The cells are electrically programmable as a non-volatile memory. This results in a single chip design featuring both, a dynamic random access memory (DRAM) and an electrically programmable-read-only-memory (EPROM). The DRAM and the EPROM integrated in the PNDRAM can be easily reconfigured at any time, whether during manufacturing or in the field. The PNDRAM has multiple applications such as combining a main memory with ID, BIOS, or operating system information in a single chip.

20 Claims, 4 Drawing Sheets

PARTIALLY NON-VOLATILE DYNAMIC RANDOM ACCESS MEMORY FORMED BY A PLURALITY OF SINGLE TRANSISTOR CELLS USED AS DRAM CELLS AND EPROM CELLS

FIELD OF THE INVENTION

This invention is related to semiconductor memories and, more particularly, to a partially non-volatile DRAM which is formed by a plurality of single transistor cells used as DRAM cells and EPROM cells.

BACKGROUND OF THE INVENTION

CMOS technology has evolved such that the computer market has rapidly opened up to a wide range of consumers. Today's multi-media computer uses 64 MB main memory typically with 64 Mb Dynamic Random Access Memories (DRAMs). In the near future, 1 GB main memory will become commonplace, which will suggest a potentially strong research and development for 1 Gb DRAMs and beyond, with extremely deep sub-micron technology. Despite the main memory density requirement, it is even more important in the memory marketplace to have non-volatile memory features in a system. The typical NVRAMs (Non-Volatile Random Access Memory) are a mask-ROM, an EPROM (Electrically Programmable Read Only Memory), or a flash-RAM, and used for ID, BIOS, or core of the O/S (Operating System). These NVRAMs, however, have a unique and different standard from the DRAM standard used for a main memory configured with DRAMs. This results in copying the information stored in the NVRAM to the DRAM during the system initialization phase. A DRAM compatible flash-RAM allows for direct execution, which is an ideal solution. It is, however, inflexible to configure the density of the chip, since it had been pre-determined in the chip design. The unused bits are difficult to use for a general purpose main memory because of a poor write-speed and a limited endurance.

OBJECTS OF THE INVENTION

It is, therefore, an object of the invention to provide a Partially Non-Volatile Dynamic Random Access Memory (PNDRAM).

It is another object of the invention to structure the PNDRAM with one transistor cells (1T Cells), each preferably consisting of a DRAM cell and an EPROM cell.

It is still another object of the invention to have the PNDRAM to allow IDs, BIOS or the core of an operating System (O/S) to be stored in the EPROM cells.

It is yet another object of the invention to have the 1T cells that are not used for the EPROM cells to behave as conventional DRAM cells.

It is further object of the invention to have the control protocol to access the DRAM cells and the EPROM cells to be fully compatible with existing DRAM standards.

SUMMARY OF THE INVENTION

Herein described is a semiconductor memory referred to as Partially Non-Volatile Dynamic Random Access Memory (PNDRAM). The PNDRAM consists of a plurality of one transistor (1T) or two transistor (2T) cells, acting as DRAM cells and EPROM cells. The PNDRAM allows the BIOS or the core of the OS to be stored in EPROM cells in manufacturing or in a field. The 1T (or 2T) cells, which are not used for the EPROM cells, work as conventional DRAM cells for a main memory. The control protocol to access the DRAM cells and the EPROM cells can be fully compatible with existing DRAM standards, making the direct execution possible without requiring complicated logic. The addressing space for the DRAM cells and the EPROM cells can also be flexibly configurable.

In one aspect of the invention, there is provided a partially non-volatile DRAM array formed by a plurality of cells, wherein a first subset of the plurality of cells acts as DRAM cells and a second subset of the plurality of cells acts as EPROM cells.

In a second aspect of the invention, there is provided a partially non-volatile DRAM array formed by a plurality of DRAM cells, wherein a subset of the plurality of DRAM cells is programmed to behave as EPROM cells.

In a third aspect of the invention, there is provided a method of structuring a DRAM made of a plurality of cells in a partially non-volatile memory, the method including the steps of having a first subset of the plurality of cells act as DRAM cells; and having a second subset of the plurality of cells behaves as EPROM cells.

BRIEF DESCRIPTION OF THE DRAWINGS

The foregoing and other objects, aspects and advantages will be better understood from the following description of a preferred embodiment of the invention with reference to the accompanying drawings, in which.

DETAILED DESCRIPTION OF THE INVENTION

Figure 1:
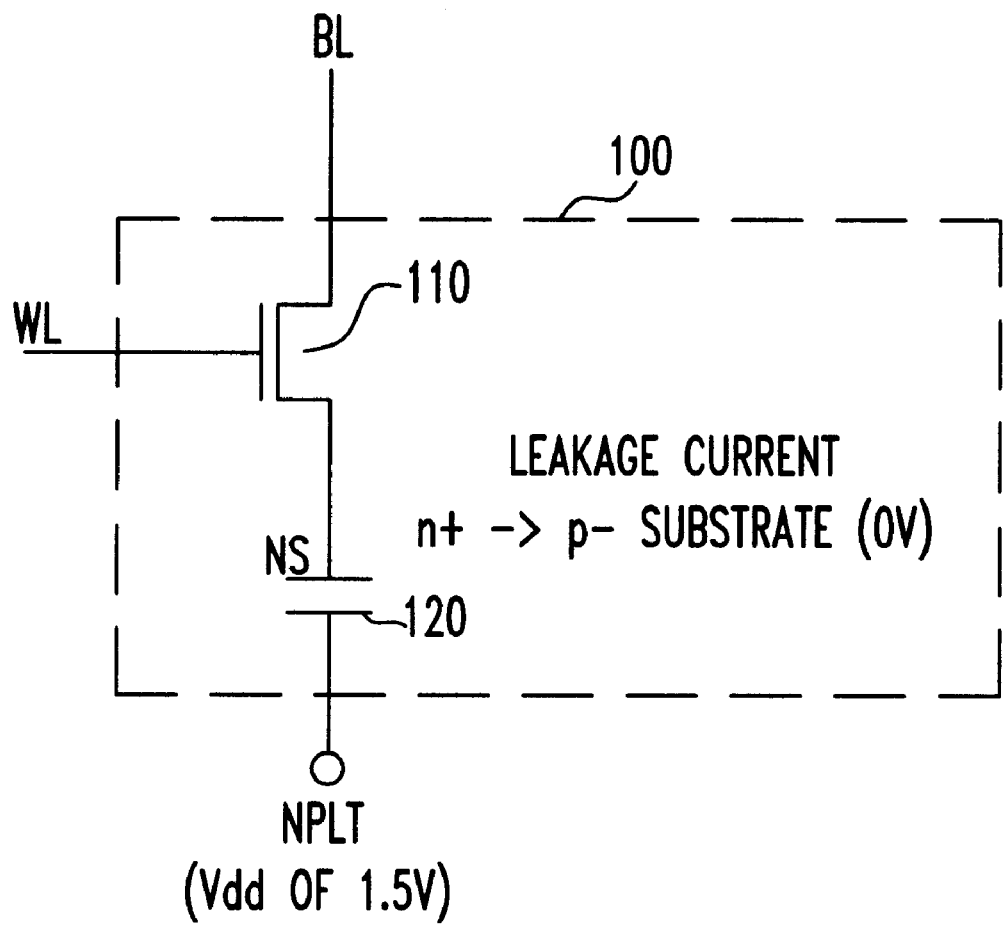
FIG. 1 shows a schematic diagram of a PNDRAM cell, in accordance with the present invention.

Referring to FIG. 1, there is shown a schematic diagram of a PNDRAM cell 100 consisting of an NMOS transistor 110 connected to a capacitor 120. Schematically, it is indistinguishable from a conventional DRAM single transistor (1T) cell. The capacitor can be fabricated using any planar, trench, or stacked cell technology. NMOS transistor 110 switches on when the wordline (WL) rises, coupling the storage node NS to the bitline BL.

Unlike conventional DRAM cells, a PNDRAM cell features two alternative functions:

1) a temporary storage, wherein the capacitor 120 stores data as a capacitive charge, or 2) a permanent storage, wherein the capacitor 120 stores data as an anti-fuse caused by oxide breakdown.

Whenever the oxide of the capacitor 120 is not in breakdown, capacitor 120 holds data at node NS when the wordline WL is at a low potential. In order to maintain physical 1 data, the voltage at node NS must be periodically refreshed. This refresh is similar to a conventional DRAM refresh operation. Physical 0 data does not require refreshing since the sources of the node NS leakage current are created by the $n^+$ diffusion of NMOS transistor 110, the substrate of which is connected to ground (0V). This results in a non-volatile memory capable of storing physical 0 data unless the cell is overwritten to be a physical 1. When the oxide of the capacitor 120 is in breakdown, the node NS is short-circuited to node NPLT, which is connected to Vdd (1.5V). This results in a non-volatile memory that stores physical 1 data.

The detailed array configuration and control methods in: (1) programming mode, and (2) read/write modes will be discussed next.

Figure 2A:
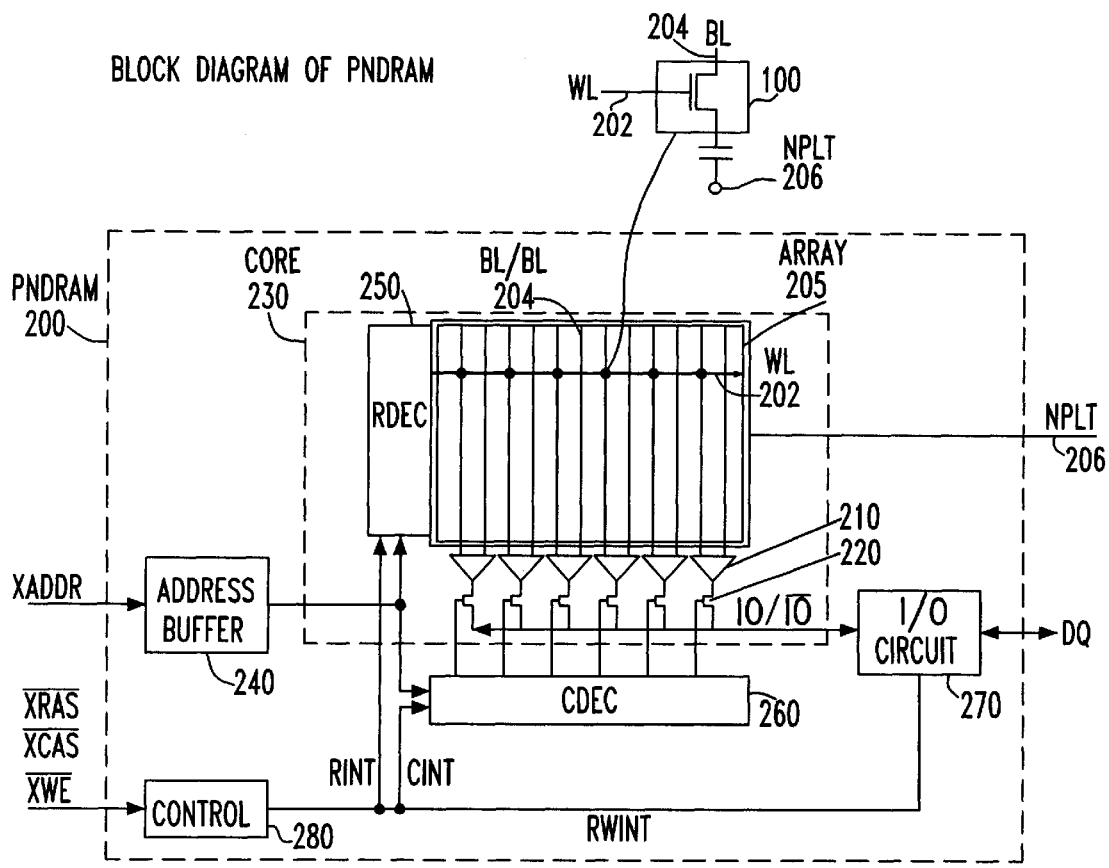
FIG. 2 is a block diagram and a timing diagram applicable to a PNDRAM, in accordance with the present invention.
Figure 2B:
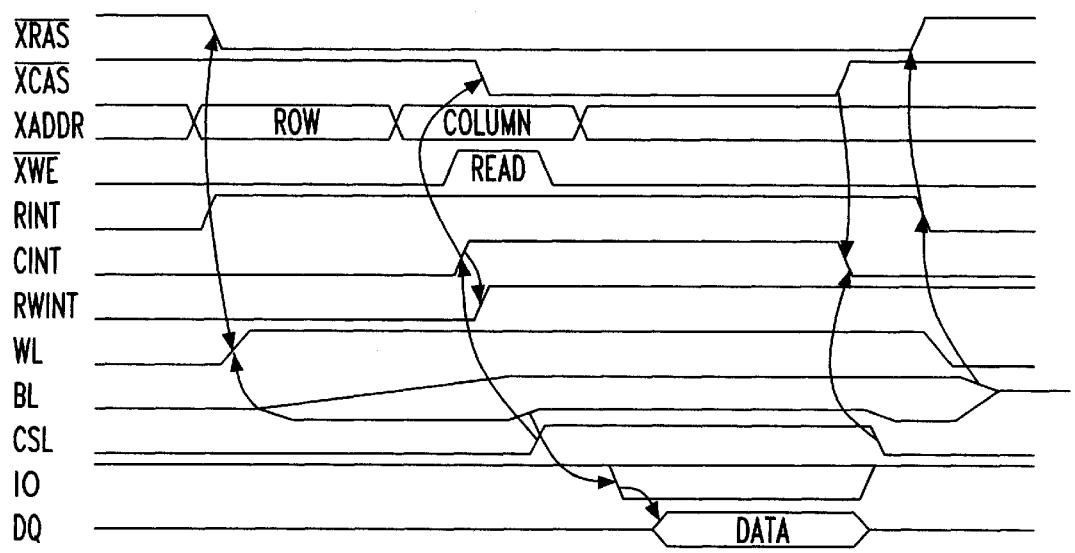

FIG. 2 shows a block diagram and the internal timing of a PNDRAM. The PNDRAM 200 consists of a core 230 consisting of cell array 205, row decoder (RDEC) 250, column decoder (CDEC) 260, sense amplifiers 210, and column switches 220. The PNDRAM core 230 is supported by address buffer block 240, control block 280, data input/output (DQ) block 270, in accordance with known DRAM protocols, including its conventional row address storable signal ($\overline{XRAS}$), column address strobe signal ($\overline{XCAS}$), and write enable signal ($\overline{XWE}$). The following discussion assumes that control pins of the PNDRAM follows existing asynchronous DRAM standards, with a row address strobe $\overline{RAS}$ and a column address strobe $\overline{CAS}$.

DRAM Cell Read and Write Modes:

When the signal $\overline{XRAS}$ falls, control block 280 generates a row internal signal, labeled RINT. RINT activates address buffer 240, triggering RDEC 250 in core 230. One wordline WL 202 in array 205 then rises in accordance with the decoded result. This allows cell data 100 to be read on bitlines BL/$\overline{BL}$ 204, generating a small voltage difference between BL and $\overline{BL}$ pair. After the signal has been sufficiently developed on the BL/$\overline{BL}$ pair, sense amplifiers 210 are enabled, latching the data in the sense amplifiers. When the signal $\overline{XCAS}$ falls, control block 250 generates a column internal signal (CINT). The state of the read/write internal signal RWINT can be determined by the polarity of $\overline{XWE}$ when $\overline{XCAS}$ falls. If XWE is at high at the falling edge of $\overline{XCAS}$, RWINT switches to high, indicative of a read mode. If $\overline{XWE}$ is at low at the falling edge of $\overline{XCAS}$, RWINT switches to low, which is indicative of a write mode. Address buffer 240 generates column addresses which are subsequently transferred to column decoder CDEC 260. Column switch 220 is activated as a function of the decoding result. This allows bit information in the corresponding sense amplifier to be transferred to IO circuit 270 by way of the data input/output bus (I/O-$\overline{I/O}$ pair). Data appears at the I/O pin when operating in read mode. A write mode operates in the opposite manner.

Figure 3:
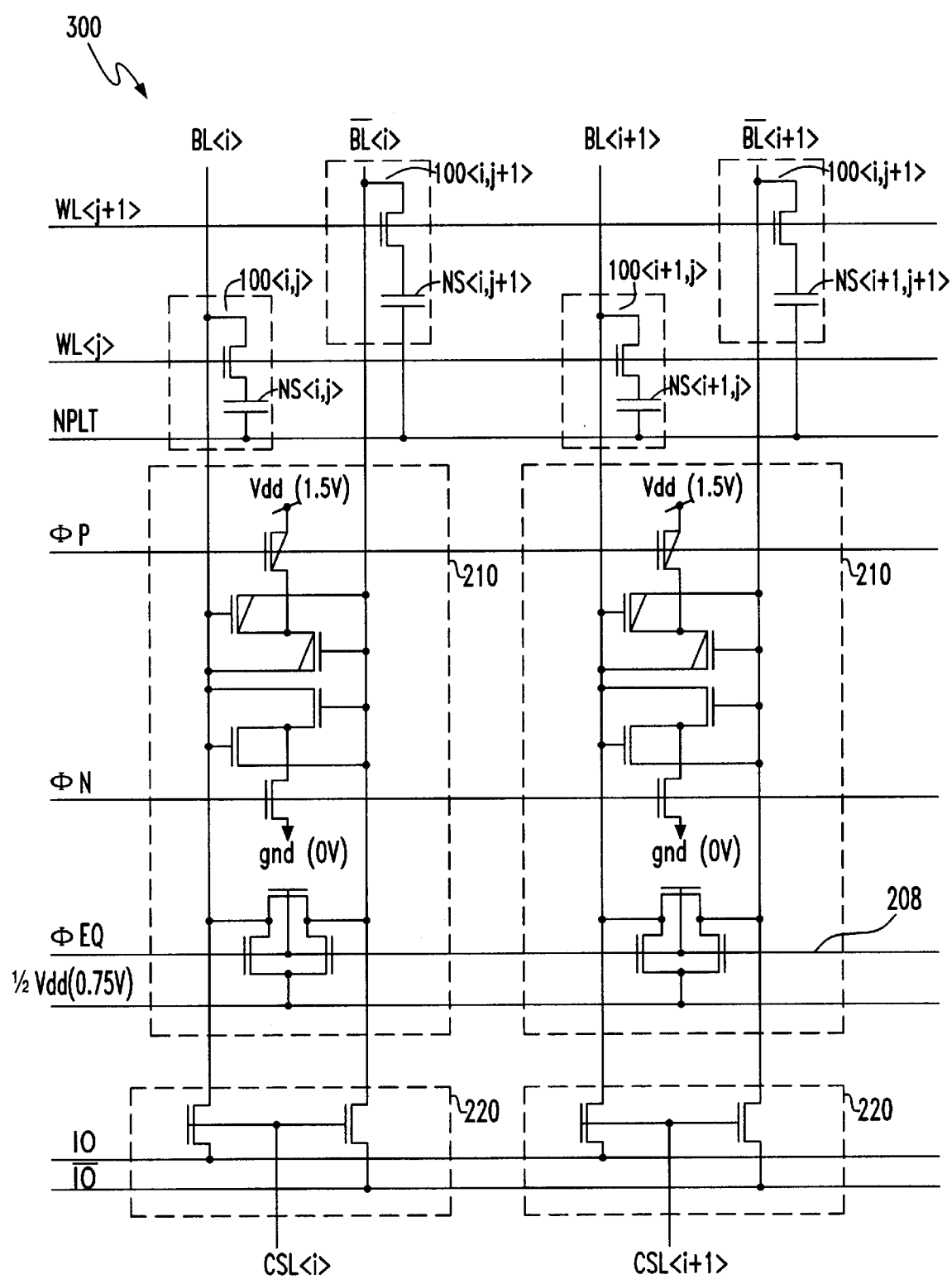
FIG. 3 is a detailed configuration of a PNDRAM core consisting of a plurality of 1T cells arranged in an array matrix, together with sense amplifiers and column switches.

FIG. 3 shows a detailed configuration of PNDRAM core 230 (FIG. 2) that consists of a plurality of 1T cells 100 arranged in an array matrix 205 (FIG. 2), CMOS cross-coupled sense amplifiers 210, and column switches 220. For simplicity sake, sense amplifiers 210 are not shared with other arrays, although in a standard DRAM array design, sense amplifiers are typically shared with bitline multiplexing (not shown). Row decoder (RDEC) 250 and column decoders (CDEC) 260, shown in FIG. 2, are thus eliminated. Unlike a DRAM, the PNDRAM array newly includes a programming mode, wherein any 1T cells 100 can be electrically programmed as an EPROM cell or as an anti-fuse, by controlling voltage signals NPLT 206 and ΦEQ 208.

The following discussion assumes that the capacitor oxide of the cell 100 is in breakdown mode when 7V are applied between NPLT and node NS. The PNDRAM is provided with a plate voltage control mode which allows node NPLT to be forced externally by multiplexing the data mask pin (DQM) or any other alternative pin (not shown). The detailed EPROM programming mode in the PNDRAM is realized by the procedures described hereinafter.

EPROM Cell Programming Mode:

Step 1: When the signal $\overline{RAS}$ (not shown) remains at high, EPDRAM is in stand-by mode, and all the wordline WLs, $\overline{\Phi P}$, ΦN, ΦEQ, CSLs alternate between gnd (0V), Vdd (1.5V), gnd (0V), Vdd (1.5V), and gnd (0V), respectively. The bitline BLs are precharged to ½ Vdd (0.75V), and all storage node NSs are isolated from the respective bitlines BL. The voltage of node NPLT and 10 lines are connected to gnd (0V) and Vdd (1.5V), respectively. [Note that the node NPLT is common to all the cells of the array].

Step 2: A plate voltage control mode is enabled, coupling node NPLT to pin DQM (not shown) or to any equivalent pin typical of a DRAM standard package. The node NPLT is then forced from its value at the DQM pin to 5V. Since all storage nodes NS are isolated from the bitlines BL, the voltage swing 0V–5V at NPLT couples nodes NS to 5V. The NS voltage is assumed to have been originally at 0V (or close to it) because of the NMOS array. Optionally, physical 0 data may be written into all the nodes NS using a DRAM write to guarantee 0V voltage. The NS voltages become, therefore, 5V.

Step 3: The signal $\overline{RAS}$ is enabled to initiate a PNDRAM refresh mode, which is similar to any typical DRAM refresh protocol. This switches ΦEQ to low, disabling the bitline BL equalizers. The following discussion assumes that cell 100<i,j> needs to be programmed as an EPROM cell. The corresponding WL<i> rises to the boosted WL voltage (3V). Cells 100<i,j> and 100<i+1,j> initiate a signal. Nodes NS<i,j> and NS<i+1,j> are coupled to bitlines BLi and BLi+1, respectively. The voltages at BL<i> and BL<i+1> increase by a certain amount (e.g., 300 mV). Signals ΦN and ΦP then switch to high and low, respectively. CMOS sense amplifiers 210 are activated, as it is done in a conventional DRAM ½ Vdd sensing scheme. BL<i>, $\overline{BL}$<i>, BL<i+1> and $\overline{BL}$<i+1> become 1.5V, 0V, 1.5V and 0V, respectively, once the sense amplifiers 210 have amplified the bitlines BL voltages.

Step 4: As it is done in a conventional DRAM write mode, the signals $\overline{CAS}$ and $\overline{WE}$ (not shown) are activated, thereby writing physical 0 data in cell <i,j>. IO and $\overline{IO}$ are forced to 0V and 1.5V, respectively, switching the corresponding CSL<i> to high (1.5V). BL<i> and $\overline{BL}$<i> forced by IO (0V) and $\overline{IO}$ (1.5V), correspondingly switch BL<i> and $\overline{BL}$<i> to low (0V) and high (1.5V), respectively. This allows node NS<i,j> to switch to 0V. [Note: BL<i+1> and $\overline{BL}$<i+1> remain at 1.5V and 0V, respectively, while NS<i+1,j> remains at 1.5V].

Step 5: Node NPLT is boosted from 5V to 7V. Nodes NS<i,j+1> and NS<i+1,j+1> switch to 7V due to the swing of node NPLT. On the other hand, nodes NS<i,j> and NS<i+1,j> remain at 0V and 1.5V, respectively, because they are forced by the corresponding sense amplifiers 210. [Note that the voltage difference between node NS<i,j> and node NPLT is 7V, resulting in the cell oxide breaking down]. As a result, node NS<i,j> is short-circuited to node NPLT. Node NS<i+1,j>, on the other hand, is not short-circuited to node NPLE since the voltage of NS<i+1,j> remains at high (1.5V) when only 5.5V are applied to the capacitor of cell 100<i+1,j>. Similarly, the voltages of the capacitors of cells 100<i,j+1> and 100<i+1,j+1> are 0V, thereby precluding an oxide breakdown from occurring.

Step 6: Steps 0–5 are repeated to program any cells as EPROM cells by design or by customer's request.

EPROM Cell Read Mode:

The PNDRAM Read mode operation is essentially the same as it was done for the DRAM cell read mode discussed previously. Node NPLT is coupled to Vdd (1.5V). If node NS of cell 100 is not short-circuited to node NPLT, the cell will behave as any conventional DRAM cell or as a physical 0 EPROM cell. If short-circuited to node NPLT, the read result will be a physical 1, and the cell will behave as a physical 1 EPROM cell. There is no write mode for a PNDRAM except for the one time programming mode discussed previously.

DRAM cells need to be refreshed in a conventional refresh operation. Although the EPROM cells do not require it, optionally they can also be refreshed as it is routinely done to conventional DRAM cells. This allows maintaining existing DRAM standard.

Figure 4:
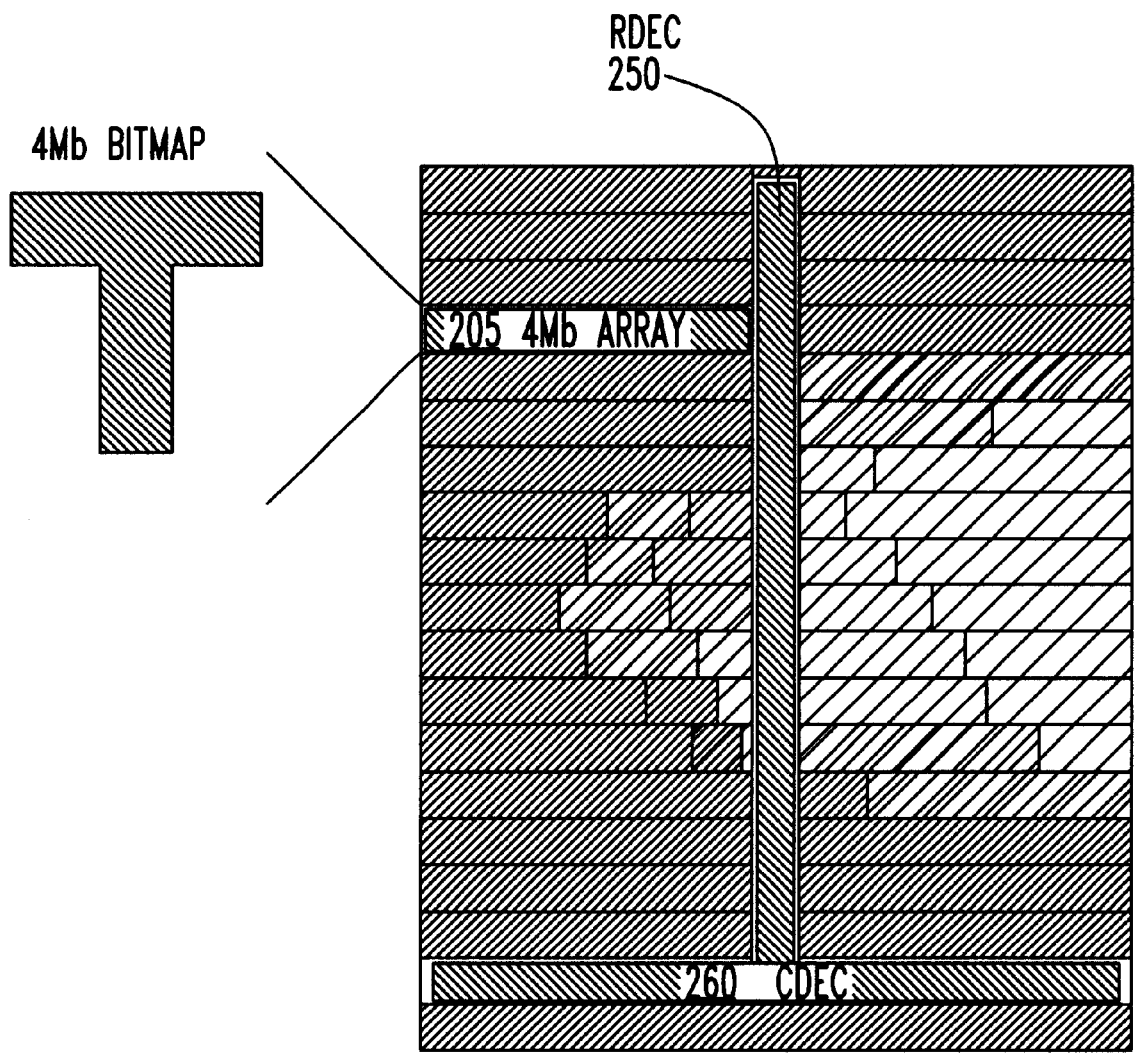
FIG. 4 shows a 128 Mb PNDRAM core consisting of 32 4 Mb arrays, and adjoining row decoders and column decoders.

FIG. 4 shows an experimental 128 Mb PNDRAM core 230 consisting of thirty-two 4 Mb arrays (205), row decoder (RDEC) 250, and column decoder (CDEC) 260. The concept of the PNDRAM has been confirmed by an experimental 128 Mb DRAM by enabling the proposed PNDRAM protocol and methodology with one 4 Mb array (205). It also shows the bit-map wherein cells showing T-shape are electrically programmed. [Note: other cells operate as DRAM cells]. The cells electrically programmed can maintain the data even after the chip is powered off. Optionally, all cells, regardless whether DRAM or EPROM cells, may write a physical 0 data pattern as the power-on mode. This power-on mode guarantees that the EPROM cells having this physical 0 data actually store a physical 0. The power-on mode may be enabled by either an external PNDRAM command or internally by on-chip control logic.

Although the invention in its preferred embodiment uses a $8F^2$ 1T transistor cells, the concept can be applicable for any type of cells such as $7F^2$, $6F^2$, $5F^2$, and $4F^2$.

In summary, the invention provides control methods and applications to have 1T (or 2T) cells behave as DRAM cells and EPROM cells. The oxide breakdown voltage is applied to EPROM cells selected by the WL, CSL, sense amplifiers, and plate voltage control. The invention also assumes a ½ Vdd sensing scheme. However, any Vdd pre-charged sensing schemes are applicable for a given reference voltage.

While the invention has been discussed in terms of a preferred embodiment with 8F ½ Vdd sensing scheme, those skilled in the art will recognize that other changes and modifications may be introduced without affecting the scope and the spirit of the invention.

What is claimed is:

1. A partially non-volatile memory array comprising a plurality of memory cells, each of said memory cells comprising a capacitor, wherein data is stored by electrically charging a first subset of said cell capacitors and data is stored by breaking-down a second subset of said cell capacitors.

2. The partially non-volatile memory array of claim 1, wherein each of said cells further comprises a switching means, said capacitor being coupled to a bitline when said switching means switches ON.

3. The partially non-volatile memory array of claim 2, wherein the gate of a transistor in each of said cells is coupled to a wordline, which in turn couples said capacitor to said bitline.

4. The partially non-volatile memory array of claim 1, wherein said cells are one transistor (1T) cells.

5. The partially non-volatile memory array of claim 4, wherein said 1T cells permanently store a physical-1 condition by break-down of said capacitor of said 1T cell when said 1T cell operates as an EPROM cell.

6. The partially non-volatile memory array of claim 4, wherein a physical-0 is temporarily stored in said 1T cell by a leakage current created by an $n^+$ diffusion to a grounded substrate of said 1T cell, said physical-0 remaining for as long as power remains turned on.

7. The partially non-volatile memory array of claim 1, wherein said cells are refreshed regardless of their acting as DRAM cells or EPROM cells.

8. The partially non-volatile memory array of claim 1, wherein wordlines (WLs) and column select lines (CSLs) select said DRAM cell and said EPROM cell when said DRAM cells and said EPROM cells operate in read mode, write mode, or in a EPROM programming mode.

9. The partially non-volatile memory array of claim 1, further comprising a power-up mode to initialize said EPROM cells with a physical-0.

10. The partially non-volatile memory array of claim 9, wherein said power-up mode is enable by an external command or internally by way of on-chip control logic.

11. The partially non-volatile memory array of claim 1, wherein bitline sense amplifiers sense said DRAM cells and said EPROM cells, and wherein said bitline sense amplifiers selectively apply a breakdown voltage to a corresponding one of said cells acting as an EPROM cell.

12. The partially non-volatile memory array of claim 1, wherein a first plurality of said DRAM cells and said EPROM cells act as temporary voltage storage cells and a second plurality of said DRAM cells and said EPROM cells act as permanent voltage storage cells.

13. The partially non-volatile memory array of claim 1, wherein said DRAM cells and said EPROM cells are structured as a main memory and as identification (ID) fuses.

14. The partially non-volatile memory array of claim 13, wherein said ID fuses store product information, manufacturing information or process information.

15. The partially non-volatile memory array of claim 1, wherein said DRAM cells and said EPROM cells form a main memory, said cells further providing BIOS system information.

16. The partially non-volatile memory array of claim 1, wherein said DRAM cells and said EPROM cells forming said main memory also provide operating system information.

17. A partially non-volatile memory array comprising a plurality of DRAM cells having each a capacitor, wherein a subset of said plurality of DRAM cells is programmed to operate as EPROM cells by breakdown of said capacitors of said subset of said plurality of DRAM cells.

18. The partially non-volatile memory array recited in claim 17, wherein said DRAM cells are 1T cells.

19. A method of structuring a memory device as a partially non-volatile memory, said memory device comprising a plurality of memory cells having each a capacitor, the method comprising the steps of:

temporarily storing data by electrically charging a first subset of said cell capacitors; and permanently storing data by breaking-down a second subset of said cell capacitors.

20. The method as recited in claim 19, where said first subset of said plurality of cells operate as DRAM cells, and second subset of said plurality of cells operates as EPROM cells.

* * * * *